United States Patent [19]
Kozaki et al.

[11] Patent Number: 5,242,782
[45] Date of Patent: Sep. 7, 1993

[54] METHOD FOR PRODUCING A PHOTOCURED IMAGE STRUCTURE

[75] Inventors: Shuji Kozaki; Shohei Nakamura, both of Fuji, Japan

[73] Assignee: Asahi Kasei Kogyo Kabushiki Kaisha, Osaka, Japan

[21] Appl. No.: 643,272

[22] Filed: Jan. 22, 1991

[30] Foreign Application Priority Data

Jan. 22, 1990 [JP] Japan ................................ 2-10575
Oct. 3, 1990 [JP] Japan ................................ 2-263892

[51] Int. Cl.$^5$ .................................................. G03C 5/24
[52] U.S. Cl. .................................. 430/306; 430/309; 430/331; 134/38
[58] Field of Search .................... 430/306, 309, 331; 134/38

[56] References Cited

U.S. PATENT DOCUMENTS

| | | | |
|---|---|---|---|
| 3,891,443 | 6/1975 | Halpern et al. | 430/259 |
| 3,984,582 | 10/1976 | Feder et al. | 427/43 |
| 4,394,435 | 7/1983 | Farber et al. | 430/287 |
| 4,447,510 | 5/1984 | Frass et al. | 430/306 |

FOREIGN PATENT DOCUMENTS

| | | |
|---|---|---|
| 0037060 | 7/1981 | European Pat. Off. |
| 0185280 | 6/1986 | European Pat. Off. |
| 9002359 | 3/1990 | PCT Int'l Appl. |
| 2139777 | 11/1984 | United Kingdom |

OTHER PUBLICATIONS

USSN 07/392,536, Aug. 15, 1989.

Primary Examiner—Hoa Van Le
Attorney, Agent, or Firm—Birch, Stewart, Kolasch & Birch

[57] ABSTRACT

A method for producing a photocured image structure, comprising providing a selectively photocured elastomer composition layer having a photocured image portion and an uncured portion, and contacting the selectively photocured elastomer composition layer with a developer comprising a specific ester and optionally a specific alcohol in a specific volume ratio, to wash-out the uncured portion and develop the photocured image portion, thereby obtaining the photocured image structure. By this method, not only is the swelling of the image structure minimized but also the danger of relief breakage and orange peel formation is eliminated, so that an excellent photocured image structure can be produced by a simple operation.

13 Claims, No Drawings

METHOD FOR PRODUCING A PHOTOCURED IMAGE STRUCTURE

BACKGROUND OF THE INVENTION

1. Field of the Invention

The present invention relates to a novel method for producing a photocured image structure. More particularly, the present invention is concerned with a method for producing a photocured image structure by contacting a selectively photocured elastomer composition layer with a specific developer, thereby obtaining a photocured image structure, which method can be used for producing a photocured image structure while minimizing the swelling of the photocured image structure and without the danger of breakage of the photocured image structure and the danger of the formation of stains (known as "orange peel") on the photocured image structure. The photocured image structure obtained by the method of the present invention is especially suitable for use as a flexographic printing plate.

2. Discussion of the Related Art

Production of a photocured image structure from a photocurable elastomer composition is conducted by imagewise exposing a photocurable elastomer composition layer to actinic rays through an image-bearing transparency and then contacting the exposed, imagewise photocured composition layer with a solvent (developer) capable of dissolving the unexposed (uncured) portion of the exposed composition layer, to thereby wash-out the uncured portion and develop the photocured image portion.

In general, as a photocurable elastomer composition for producing a flexographic printing plate, a composition comprising, as the main ingredients, (a) a diene polymer, (b) an ethylenically unsaturated compound and (c) a photopolymerization initiator, is utilized. In the case of such a composition, the washing-out of the uncured portion after imagewise exposure cannot be performed by means of water or an aqueous solvent since the diene polymer as one of the main ingredients is insoluble in any of water and an aqueous solvent. Therefore, in the case of such a composition, the washing-out of the uncured portion has conventionally been conducted by using, as a developer, a chlorine-containing organic solvent, such as perchloroethylene and 1,1,1-trichloroethane, singly or in combination with an alcohol.

These chlorine-containing organic solvents are advantageous from the viewpoint of safety in handling, due to their inflammability. However, these chlorine-containing organic solvents pose great health problems since these solvents are very toxic to the human body. Moreover, these chlorine-containing organic solvents are known cause destruction of the protective ozone layer surrounding the earth. Therefore, a developing solvent which contains no chlorine has been desired from the viewpoint of improving the working environment and of the prevention of air pollution and environmental destruction.

Further, when a chlorine-containing solvent is used as a developer, not only is disadvantageously great the swelling of the photocured image structure produced by photocuring a photocurable elastomer composition, so that it takes a long drying time for the swollen image structure to recover its original dimensions, but also the photocured image structure is likely to be broken especially in relief portions corresponding to fine lines or small dots and stains known as "orange peel" are likely to be formed on the relief structure during the drying. Thus, a method in which use is made of a developing solvent which is free from the problems accompanying the chlorine-containing solvent and is improved in performance, has been desired.

SUMMARY OF THE INVENTION

The present inventors have made extensive and intensive studies with a view toward solving the above-mentioned problems accompanying the prior art and toward providing a method for producing a photocured image structure without an occurrence of the swelling and breakage of the photocured image structure and the formation of orange peel as well as without the danger of posing problems with respect to human health and environment. As a result, the present inventors have found that by the use of an organic solvent comprising a specific ester and optionally a specific alcohol in a specific volume ratio, the above objective can be attained. Based on this finding, the present invention has been completed.

Accordingly, it is an object of the present invention to provide a method for producing a photocured image structure without an occurrence of the swelling and breakage of the image structure and the formation of orange peel as well as without the danger of causing problems with respect to health and environment.

The foregoing and other objects, features and advantages will be apparent to those skilled in the art from the following detailed description and appended claims.

DETAILED DESCRIPTION OF THE INVENTION

According to the present invention, there is provided a method for producing a photocured image structure, comprising:

(1) providing a selectively photocured elastomer composition layer having a photocured image portion and an uncured portion; and (2) contacting the selectively photocured elastomer composition layer with a developer to wash-out the uncured portion and develop the photocured image portion, thereby obtaining a photocured image structure, wherein said developer comprises compound (A) and compound (B), which are respectively represented by the following formulae, in a volume ratio, of compound (A) to compound (B), of from 100/0 to 40/60:

wherein
$R^1$ represents $CH_3$ or $C_2H_5$, and
$R^2$ represents an alkoxyalkyl group of the formula:

wherein n and m are integers satisfying the inequalities:
$n+m \leq 5$, $n \geq 1$ and $m \geq 1$, or an alkylpolyoxyalkylenyl group of the formula:
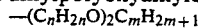

wherein n is an integer of from 2 to 6 and m is an integer of from 1 to 4, and

wherein
R³ represents an alkyl group of the formula:

$-C_nH_{2n+1}$ wherein n is an integer of from 3 to 10, an aralkyl group of the formula:

$-C_nH_{2n}\cdot Ar$ wherein Ar represents an aromatic group and n is an integer of from 1 to 3, or an alkylpolyoxyalkylenyl group of the formula:

$-(C_nH_{2n}O)_aC_mH_{2m+1}$ wherein n is an integer of from 2 to 6, m is an integer of from 1 to 4 and a is 1 or 2 and n, m and a are integers satisfying the inequality:

$a/(na+m) \geq \frac{1}{4}$.

Suitable examples of photocurable elastomer compositions which may be used for preparing the selectively photocured elastomer composition layer to be used in the method of the present invention, include a photocurable elastomer composition comprising, as the main ingredients, (1) 30 to 99 % of a diene polymer, (2) 1 to 70 % of an ethylenically unsaturated compound and (3) an effective amount of a photopolymerization initiator.

As diene polymer component (1), there can be used a polymer obtained by homopolymerizing a conjugated diene monomer or copolymerizing a conjugated diene monomer with a monoolefin compound.

Examples of conjugated diene monomers include butadiene, isoprene and chloroprene.

Examples of monoolefin monomers which may be copolymerized with the conjugated diene monomer include styrene, α-methyl styrene, vinyltoluene, acrylonitrile, (meth)acrylic acid and esters thereof. These monoolefin compounds may be used individually or in combination, for copolymerization with the conjugated diene monomer.

Diene polymers which are most suitably employed in a photocurable elastomer composition, which is to be used producing a flexographic printing plate, are copolymers selected from a styrene-butadiene block copolymer and a styrene-isoprene block copolymer. The method of the present invention can be most effectively practiced by using a selectively photocured elastomer composition layer prepared from a photocurable elastomer composition employing at least one of the above-mentioned block copolymers as diene polymer component (1).

Ethylenically unsaturated compound component (2) and photopolymerization initiator component (3) can be selected from those which are customarily employed in a photocurable elastomer composition of this type.

Examples of ethylenically unsaturated compounds include diacrylates or dimethacrylates of ethylene glycol, diethylene glycol, propylene glycol, dipropylene glycol, polyethylene glycol, polypropylene glycol or butylene glycol; trimethylolpropane triacrylate or trimethacrylate, pentaerythritol tetracrylate or tetramethacrylate, N,N'-hexamethylenebisacrylamide or methacrylamide, diacetoneacrylamide or methacrylamide, styrene, vinyltoluene, divinylbenzene, diallyl phthalate, triallyl cyanurate, diethyl fumarate, dibutyl fumarate, dioctyl fumarate, distearyl fumarate, butyloctyl fumarate, diphenyl fumarate, dibenzyl fumarate, dibutyl maleate, dioctyl maleate, bis(3-phenylpropyl) fumarate, dilauryl fumarate and dibehenyl fumarate. These may be used individually or in combination.

Examples of photopolymerization initiators include benzophenone, Michler's ketone, benzoin, benzoin methyl ether, benzoin ethyl ether, benzoin isopropyl ether, benzoin isobutyl ether, α-methylolbenzoin, α-methylolbenzoin methyl ether, α-methoxybenzoin methyl ether, benzoin phenyl ether, α-t-butyl benzoin, 2,2-dimethoxyphenylacetophenone, 2,2-diethoxyphenylacetophenone, 2,2-diethoxy acetophenone, benzil, pivaloin, anthraquinone, benzanthraquinone, 2-ethyl anthraquinone and 2-chloroanthraquinone. These may be used individually or in combination.

Representative examples of photocurable elastomer compositions which may be used for producing the selectively photocured elastomer composition layer to be used in the present invention include those described in U.S. Pat. Nos. 4,737,521, 4,045,231, 4,197,130, 4,177,074, 4,266,005 and 4,446,440 (these U.S. Patents respectively correspond to Japanese Patent Application Laid-Open Specification Nos. 47-37521, 51-106501, 53-127004, 54-110287, 55-48744 and 58-62640) and Japanese Patent Application Laid-Open Specification No. 52-64301.

The selectively photocured elastomer composition layer to be used in the present invention can be obtained by a method in which the photocurable elastomer composition is imagewise exposed to actinic rays through an image-bearing transparency, to thereby selectively photocure the elastomer composition layer in accordance with the transmitting pattern of the image-bearing transparency so that the selectively photocured elastomer composition layer has a photocured image portion formed therein and an uncured portion. The above method of exposure may optionally comprise the step of back exposure in which the photocurable elastomer composition layer is exposed to actinic rays from the side of the layer remote from the image-bearing transparency for a short period of time before or after the imagewise exposure, to thereby form a thin cured layer (back layer) of the elastomer composition over the entire area of this side.

In the method of the present invention, the selectively photocured elastomer composition layer having a photocured image portion and an uncured portion is contacted with a developer to wash-out the uncured portion and develop the photocured image portion, thereby obtaining a photocured image structure.

The method for contacting the selectively photocured elastomer composition layer with a developer to wash-out the uncured portion and develop the photocured image portion, is not particularly limited. The contact of the selectively photocured elastomer composition layer with a developer to wash-out the uncured portion and develop the photocured image portion can be performed by any of customary methods, such as a brushing method and a spray method.

The developer to be used in the method of the present invention comprises compound (A) and compound (B), which are respectively represented by the following formulae, in a volume ratio, of compound (A) to compound (B), of from 100/0 to 40/60:

$R^1COOR^2$  (A)

wherein
R¹ represents CH₃ or C₂H₅, and
R² represents an alkoxyalkyl group of the formula:

$$-C_nH_{2n}OC_mH_{2m+1}$$

wherein n and m are integers satisfying the inequalities:
$n+m \geq 5$, $n \geq 1$ and $m \geq 1$, or an alkylpolyoxyalkylenyl group of the formula:

$$-(C_nH_{2n}O)_2C_mH_{2m+1}$$

wherein n is an integer of from 2 to 6 and m is an integer of from 1 to 4, and $$R^3OH \quad (B)$$

wherein
R³ represents an alkyl group of the formula:

$$-C_nH_{2n+1}$$

wherein n is an integer of from 3 to 10, an aralkyl group of the formula:

$$-C_nH_{2n}\cdot Ar$$

wherein Ar represents an aromatic group and n is an integer of from 1 to 3, or
an alkylpolyoxyalkylenyl group of the formula:

$$-(C_nH_{2n}O)_aC_mH_{2m+1}$$

wherein n is an integer of from 2 to 6, m is an integer of from 1 to 4 and a is 1 or 2 and n, m and a are integers satisfying the inequality:

$$a/(na+m) \geq \tfrac{1}{4}.$$

It is preferred that the developer comprise compound (A) and compound (B) in a volume ratio, of compound (A) to compound (B), of from 80/20 to 50/50.

When R³ of compound (B) is an aralkyl group of the formula —$C_nH_{2n}\cdot Ar$, the aromatic group (represented by "Ar") of the aralkyl group is not particularly limited. It is preferred, however, that the aromatic group be a substituted or unsubstituted benzene ring having 6 to 8 carbon atoms.

Compound (A) is selected from esters of acetic acid or propionic acid. Examples of these esters include 3-methoxybutyl acetate, 3-methoxybutyl propionate, 4-(4'-methoxybutoxy)butyl acetate and 2-(2'butoxyethoxy)ethyl acetate.

Compound (B) is selected from alcohols. Examples of alcohols include isopropanol, butanol, 1-pentanol, 2-methylpropanol, hexanol, heptanol, n-octanol, 2-ethylhexanol, nonyl alcohol, decyl alcohol, benzyl alcohol, 2-phenylethanol, 3-methoxybutanol, 2-butoxyethanol, 4-(4'-methoxybutoxy)butanol and 3-methoxy-3-methylbutanol.

Each of compound (A) and compound (B) may be a combination of two or more types of employable compounds, if desired.

Compound (A) has properties such that it can readily dissolve a photocurable elastomer composition, whereas compound (B) has almost or completely no capability of dissolving a photocurable elastomer composition.

Compound (B) has the following two characteristics.

First, compound (B) improves the effect of compound (A) for the suppression of swelling of a photocured image structure.

Next, when the selectively photocured elastomer composition layer has a polyamide-made flexible polymer film for facilitating close contact of the composition layer with an image-bearing transparency, compound (B) of the developer serves to easily dissolve the flexible polymer film. In this connection, it should be noted that when the flexible polymer film, which should be transparent to actinic rays, is made of a material other than polyamide, such as a cellulose derivative, the flexible polymer film can be dissolved by the developer even when the developer does not contain compound (B).

Compound (B) is optionally employed in the developer in combination with compound (A), in a volume ratio, of compound (A) to compound (B), of from 100/0 to 40/60.

Of the compounds represented by formula (A), particularly preferred are an alkoxyalkyl acetate represented by the formula:

$$CH_3COOC_nH_{2n}OC_mH_{2m+1}$$

wherein n and m are integers satisfying the inequalities:

$n+m \geq 5$, $n \leq 1$ and $m \leq 1$, and an alkylpolyoxyalkylenyl acetate represented by the formula:

$$CH_3COO(C_nH_{2n}O)_2C_mH_{2m+1}$$

wherein n is an integer of from 2 to 6 and m is an integer of from 1 to 4.

These compounds are preferred from the viewpoint of the reduction of swelling of a photocured image structure and the reduction of breakage of the image structure in fine lines or letters and small dots and the viewpoint of the increase in the rate of the recovery of original dimensions by a swollen image structure after development while attaining an excellent dissolving effect for a photocurable elastomer composition.

In the case of the conventional method in which a chlorine-containing solvent is used for developing a photocured image portion from a selectively photocured elastomer composition layer, particularly when the composition employs a diene polymer, it is likely that stains called "orange peel" are formed on the surfaces of the obtained photocured image structure during the drying, thereby rendering necessary an additional step to wipe off the stains (hereinafter often referred to as "orange peel") by using a fresh solvent.

By contrast, in the case of the method of the present invention in which the above-described specific developer is used, the occurrence of the formation of orange peel is effectively minimized. Further, particularly when an alkoxyalkyl acetate represented by the formula:

$$CH_3COOC_nH_{2n}OC_mH_{2m+1}$$

wherein n and m are integers satisfying the inequalities:

$n+m \leq 5$, $n \geq 1$ and $m \geq 1$ is used as compound (A) of the developer, formation of the orange peel is completely suppressed so that there is no need for an additional step to wipe off the orange peel after the drying.

Representative examples of alkoxyalkyl acetates include 2-methoxybutyl acetate, 3-methoxybutyl acetate and 4-methoxybutyl acetate. Of these, 3-methoxybutyl acetate exhibits especially excellent properties.

In general, as the material for a flexible polymer film provided on a photocurable elastomer composition layer for facilitating the close contact between the composition layer and an image-bearing transparency, cellulose derivatives or polyamides are used.

Where the flexible polymer film is made of a cellulose derivative, such as ethyl cellulose and cellulose acetate butylate, the dissolving of the flexible polymer film, together with the uncured portion of the selectively photocured elastomer composition layer, can be performed even when the developer comprises only compound (A). Further, in such a case, the type of compound (B) optionally used in combination with compound (A) is not limited.

On the other hand, where the flexible polymer film is made of a polyamide, the type of developer which can be used for dissolving the flexible polymer film together with the uncured portion of the selectively photocured elastomer composition layer, is limited. Examples of mixed solvents which can be used as the developer for dissolving the polyamide-made flexible polymer film together with the uncured portion, include the following two types of mixed solvents, (I) and (II): (I) a mixed solvent prepared by mixing an alkoxyalkyl acetate represented by the formula, as compound (A):

$CH_3COOC_nH_{2n}OC_mH_{2m+1}$ wherein n and m are integers satisfying the inequalities:

$n+m \geq 5$, $n \leq 1$ and $m \leq 1$, with an alcohol represented by the formula, as compound (B):

$C_nH_{2n+1}OH$ wherein n is an integer of from 3 to 10, in a volume ratio, of compound (A) to compound (B), of from 95/5 to 40/60 [of mixed solvents of type (I) above, particularly preferred is a solvent which comprises compound (A) and compound (B), n of compound (B) being 5 to 7, in a volume ratio, of compound (A) to compound (B), of from 90/10 to 70/30, from the viewpoint of satisfactory dissolving properties with respect to both the polyamide-type flexible polymer film and the photocurable elastomer composition and the viewpoint of a sufficiently high flash point for safety in handling and storing of the developer.]; and (II) a mixed solvent prepared by mixing a compound represented by the formula, as compound (A):

$R^1COOR^2$ wherein $R^1$ represents $CH_3$ or $C_2H_5$, and $R^2$ represents an alkylpolyoxyalkylenyl group of the formula:

$-(C_nH_{2n}O)_2C_mH_{2m+1}$ wherein n is an integer of from 2 to 6 and m is an integer of from 1 to 4, with a compound represented by the formula, as compound (B):

$Ar.C_nH_{2n}OH$ wherein Ar represents an aromatic group and n is an integer of from 1 to 3, in a volume ratio, of compound (A) to compound (B), of from 95/5 to 40/60.

With respect to the developer to be used in the present invention, compound (A) and compound (B) may be employed in various combinations when compound (B) is optionally employed. However, from the viewpoint of easy recycling of the developer through recovery by distillation of waste developer and the viewpoint of prevention of changes in the composition of the developer during the developing operation due to the difference in evaporation rate between the compounds, it is preferred to select the types of compound (A) and compound (B) so that compounds (A) and (B) are close to each other with respect to the boiling point.

In the method of the present invention, as described before, the manner of contacting the selectively photocured elastomer composition layer with a developer to wash-out the uncured portion and develop the photocured image portion is not particularly limited. However, this operation may generally be performed by a brushing method or a spray method. It is not necessary to heat the developer for use, and in general, a developer having a temperature of from room temperature to about 30° C. may be used. As a developing apparatus, one that is commercially available, may be employed as is.

The developing time varies depending on the formulation of the photocurable elastomer composition, the thickness of the uncured portion to be washed-out, the type of the developing apparatus and the material of the brush when a brushing method is used. However, in general, the developing time is 6 to 15 minutes for a selectively photocured elastomer composition plate having a thickness of 3 mm, and 15 to 40 minutes for a selectively photocured elastomer composition plate having a thickness of 6 mm.

The developer to be used in the method of the present invention has a flash point which is higher than room temperature and, therefore, has no particular danger of being set on fire as long as the developing operation is conducted in an ordinary fashion. However, since the developer to be used in the method of the present invention is a combustible material, it is desirable that appropriate safety measures be taken, such as partitioning of a work place, when the work place is of a structure in which it is possible that a potential source of fire (i.e., sparks) contacts the developer or air containing a large amount of the evaporated developer.

After the uncured portion of the selectively photocured elastomer composition layer is removed by means of a developer, the resultant photocured image structure may be dried at an elevated temperature.

Before or after the drying operation, the photocured image structure may further be optionally subjected to post exposure in which the image structure is further irradiated with actinic rays to perform a complete curing of the entire structure.

By the method of the present invention, a photocured image structure can advantageously be produced since the swelling of the photocured image structure is advantageously minimized so that the photocured image structure recovers its original dimensions in a short period of time. Moreover, by the method of the present invention, a photocured image structure can be produced without a danger that fine relief portions of the photocured image structure are broken by the action of a developer and a danger that the orange peel is formed over the photocured image structure during the drying after the development (if any orange peel is formed, it is necessary to remove the orange peel by conducting an additional wiping operation using a fresh solvent). The method of the present invention can be utilized for the production of a wide variety of photocured image structures and is especially advantageous for producing a relief structure for use as a flexographic printing plate.

DETAILED DESCRIPTION OF PREFERRED EMBODIMENTS

The present invention will now be described in greater detail with reference to the following Examples and Comparative Examples, which should not be construed as limiting the scope of the present invention.

In the following Examples and Comparative Examples, a swell in the thickness of a photocured image structure is calculated by the following formula:

$$\text{Swell (\%)} = \frac{\text{Thickness of a swollen image structure} - \text{Original thickness}}{\text{Original thickness}} \times 100.$$

EXAMPLE 1

3 kg of a polystyrene-polybutadiene-polystyrene block copolymer (styrene content: 40 %), 1 kg of a liquid 1,2-polybutadiene, 400 g of dioctyl fumarate, 100 g of lauryl maleimide and 100 g of 2,2-dimethoxy-2-phenylacetophenone are kneaded at 130 °C. by means of a kneader, thereby obtaining a photocurable elastomer composition. The thus obtained composition is placed between two polyester films each having a thickness of 100 μm, to thereby obtain a laminate material. The resultant laminate material is placed inside a 3 mm-thick spacer and subjected to heat pressing at 110 °C., thereby obtaining a photocurable elastomer composition sheet.

The thus obtained sheet, which has a size of 30×20 cm, is subjected to light exposure from one side by means of an ultraviolet fluorescent lamp, at an intensity of 880 mJ.cm$^{-2}$. Then, the polyester film disposed on the other side of the sheet is peeled off, and an image-bearing transparency is closely disposed on the surface of the composition having had the polyester film peeled off, followed by imagewise light exposure through the image-bearing transparency by means of an ultraviolet fluorescent lamp, at an intensity of 6000 mJ.cm$^{-2}$, to thereby form a photocured relief image.

The above-obtained selectively photocured elastomer composition layer is subjected to washing-out of the uncured portion by means of a rotary brush type developing apparatus, using, as a developer, a 4:1 (v/v) mixture of 3-methoxybutyl acetate and 1-pentanol. Thus, a relief structure in which a precise image is reproduced is obtained after a wash-out time of 8 minutes The thickness of the developed layer is 2.97 mm, and the swell as from the original thickness of the layer (i.e., 2.86 mm) is found to be as small as 3.8 %. When the layer is dried at 60 °C. for 1 hour, the layer completely recovers its original thickness.

Further, in the relief structure, no breakage of relief is observed, and the relief depth of the portion corresponding to a reverse line image having a width of 400 μm is 98 μm. In addition, no orange peel is observed on the relief structure.

This relief structure is further subjected to post exposure using a GL lamp (germicidal lamp) at an intensity of 550 mJ.cm$^{-2}$ and then post exposure using a CL lamp (chemical lamp) at an intensity of 1000 mJ.cm$^{-2}$, thereby obtaining a relief printing plate.

When printing is conducted using the thus obtained printing plate fitted on a flexographic printing machine, excellent impressions are obtained.

EXAMPLE 2

Substantially the same procedure as in Example 1 is conducted except that 3-methoxybutyl acetate is employed as a developer. In this operation, a relief structure in which a precise image is reproduced can be obtained after a wash-out time of 7 minutes. The swell value of the developed layer is 4.0 %. When the layer is dried at 60 °C. for 1 hour, the layer completely recovers its original thickness. Further, no breakage of relief is observed, and the relief depth of the portion corresponding to a reverse line image having a width of 400 μm is 100 μm. In addition, no orange peel is observed on the relief structure.

COMPARATIVE EXAMPLE 1

Substantially the same procedure as in Example 1 is conducted except that a 3:1(v/v) mixture of tetrachloroethylene and n-butanol is used as a developer. After a wash-out time of 4 minutes, the swell value of the layer is disadvantageously as large as 8.3 %. When the layer is dried at 60 °C. for 1 hour, the layer still has a swell value of 1.2 %. It is necessary to leave the layer standing at room temperature for more than one day for the layer to recover its original thickness. Breakage of the relief is observed at as many as 16 portions. The relief depth of the portion corresponding to a reverse line image having a width of 400 μm is 97 μm. Further, a great number of orange peels are observed on the relief, and therefore, it is necessary to wipe off the orange peels by using a gauze which has been dipped in fresh tetrachloroethylene.

COMPARATIVE EXAMPLE 2

Substantially the same procedure as in Example 1 is conducted except that the developers indicated in Table 1 below, which contain no chlorine but are outside the scope of the developer to be used in the present invention, are individually employed. The results are also shown in Table 1.

TABLE 1

| Developer | Developing time (minute) | Swell (%) After development | Swell (%) After drying | Swell (%) One day after drying | Number of breaks in relief | Orange peel |
|---|---|---|---|---|---|---|
| 2-Ethylhexyl acetate | 7 | 5.8 | 1.7 | 0 | 4 | Present |
| 3,5,5-Trimethylhexyl acetate | 7.5 | 5.6 | 1.2 | 0 | 4 | Present |
| Cyclohexyl acetate | 6 | 6.2 | 1.0 | 0 | 38 | Present |
| 3-Methoxy-3-methylbutyl acetate | 8.5 | 4.1 | 0.4 | 0 | 5 | Present |

EXAMPLE 3

Substantially the same procedure as in Example 1 is repeated except that the developers indicated in Table 2 below are individually employed. The results are also shown in Table 2 below.

TABLE 2

| Developer | Developing time (minute) | Swell (%) After development | Swell (%) After drying | Swell (%) One day after drying | Number of breaks in relief | Orange peel |
|---|---|---|---|---|---|---|
| 3-Methoxybutyl acetate/1-pentanol = 3:1 | 8 | 3.8 | 0 | 0 | 0 | None |
| 3-Methoxybutyl acetate/1-heptanol = 4:1 | 8 | 3.9 | 0 | 0 | 0 | None |
| 3-Methoxybutyl acetate/octanol = 4:1 | 8 | 3.6 | 0 | 0 | 0 | None |
| 3-Methoxybutyl acetate/octanol = 2:1 | 8 | 3.7 | 0 | 0 | 0 | None |
| 3-Methoxybutyl acetate/octanol = 1:1 | 8 | 3.5 | 0 | 0 | 0 | None |
| 3-Methoxybutyl acetate/benzyl alcohol = 4:1 | 7.5 | 3.4 | 0 | 0 | 0 | None |
| 2-(2'-butoxyethoxy)-ethyl acetate/benzyl alcohol = 4:1 | 8 | 4.4 | 1.0 | 0 | 0 | None |

Note:
A/B = 3:1 means a 3:1 (v/v) mixture of A and B

EXAMPLE 4

3 kg of a polystyrene-polyisoprene-polystyrene block copolymer (styrene content: 20%), 138 g of polyvinyltoluene, 117 g of 1,6-hexanediol dimethacrylate and 55 g of 2,2-dimethoxyphenylacetophenone are kneaded at 130° C. by means of a kneader, thereby obtaining a photocurable elastomer composition. The thus obtained composition is placed between a 100 μm -thick polyester film and another 100 μm-thick polyester film having a soluble polyamide layer of 4 μm thickness formed thereon, so that the polyamide layer contacts the elastomer, to thereby obtain a laminate material. The resultant laminate material is placed inside a 3 mm-thick spacer and subjected to heat pressing at 10 ° C., thereby obtaining a photocurable elastomer composition sheet.

The sheet, which has a size of 30×20 cm, is subjected to light exposure from the side remote from the polyamide layer by means of an ultraviolet fluorescent lamp, at an intensity of 660 mJ.cm$^{-2}$. Then, the polyester film, with which the polyamide layer has been in contact, is peeled off while leaving the polyamide layer on the elastomer layer, and an image-bearing transparency is closely disposed on the surface of the composition layer through the polyamide layer by means of a vacuum sheet device. Then, imagewise light exposure is performed through the image-bearing transparency by means of an ultraviolet fluorescent lamp, at an intensity of 6000 mJ.cm$^{-2}$, to thereby form a photocured relief image.

The above-obtained selectively photocured elastomer composition layer is subjected to washing-out of the uncured portion by means of a rotary brush type developing apparatus, using, as a developer, a 4:1 (v/v) mixture of 3-methoxybutyl acetate and 1-pentanol. Thus, a relief structure in which a precise image is reproduced is obtained after a wash-out time of 15 minutes, and the polyamide layer on the relief has completely been dissolved away. The thickness of the developed layer is 2.88 mm, and the swell as from the original thickness of the layer (i.e., 2.82 mm) is found to be as small as 2.1 %. When the layer is dried at 60 ° C. for 1 hour, the layer completely recovers its original thickness.

What is claimed is:

1. A method for producing a photocured image structure, comprising:
   (1) providing a selectively photocured diene polymer elastomer composition layer having a photocured image portion and an uncured portion; and
   (2) contacting the selectively photocured diene polymer elastomer composition layer with a developer to wash-out said uncured portion and develop said photocured image portion, thereby obtaining a photocured image structure, wherein said developer consists essentially of compound (A) and compound (B), which are respectively represented by the following formulae, in a volume ratio, of compound (A) to compound (B), of from 100/0 to 40/60:

$$R^1COOR^2 \quad (A)$$

wherein
   $R^1$ represents $CH_3$ or $C_2H_5$, and
   $R^2$ represents an alkoxyalkyl group of the formula:

$$-C_nH_{2n}OC_mH_{2m+1}$$

wherein n and m are integers satisfying the inequalities:

$$n+m \geq 5, n \geq 1 \text{ and } m \geq 1,$$

or an alkylpolyoxyalkylenyl group of the formula:

$$-(C_nH_{2n}O)_2C_mH_{2m+1}$$

wherein n is an integer of from 2 to 6 and m is an integer of from 1 to 4, and $$R^3OH \quad (B)$$

wherein $R^3$ represents an alkyl group of the formula:

$$-C_nH_{2n+1}$$

wherein n is an integer of from 3 to 10, an aralkyl group of the formula:

$$-C_nH_{2n}\cdot Ar$$

wherein Ar represents an aromatic group and n is an integer of from 1 to 3, or an alkylpolyoxyalkylenyl group of the formula:

$$-(C_nH_{2n}O)_aC_mH_{2m+1}$$

wherein n is an integer of from 2 to 6, m is an integer of from 1 to 4 and a is 1 or 2 and n, m and a are integers satisfying the inequality:

$$a/(na+m) \leq \tfrac{1}{2}.$$

2. The method according to claim 1, wherein $R^1$ of formula (A) represents $CH_3$.

3. The method according to claim 1 or 2, wherein $R^2$ of formula (A) represents an alkoxyalkyl group represented by the formula:

$$-C_4H_8OCH_3.$$

4. The method according to claim 1, wherein said photocured image structure is a relief structure for use as a flexographic printing plate.

5. The method according to claim 1, wherein the photocured diene polymer elastomer composition comprises 30 to 99% of the diene polymer, 1 to 70% of an ethylenically unsaturated compound and an effective amount of a photopolymerization initiator.

6. The method according to claim 5, wherein the diene polymer is obtained by homopolymerizing a conjugated diene monomer or copolymerizing a conjugated diene with a monoolefin compound.

7. The method according to claim 6, wherein the conjugated diene monomer is selected from the group consisting of butadiene, isoprene and chloroprene, and the monoolefin is selected from the group consisting of styrene, α-methyl styrene, vinyl toluene, acrylonitrile, (meth)acrylic acid, an ester of (meth)acrylic acid and a mixture thereof.

8. The method according to claim 5, wherein the ethylenically unsaturated compound is selected from the group consisting of a diacrylate or dimethacrylate of ethylene glycol, diethylene glycol, propylene glycol, dipropylene glycol, polyethylene glycol, polypropylene glycol or butylene glycol; trimethylolpropane triacrylate or trimethacrylate, pentaerythritol tetracrylate or tetramethacrylate, N,N'-hexamethylenebisacrylamide or methacrylamide, diacetoneacrylamide or methacrylamide, styrene, vinyltoluene, divinylbenzene, diallyl phthalate, triallyl cyanurate, diethyl fumarate, dibutyl fumarate, dioctyl fumarate, distearyl fumarate, butyloctyl fumarate, diphenyl fumarate, dibenzyl fumarate, dibutyl maleate, dioctyl maleate, bis(3-phenylpropyl) fumarate, dilauryl fumarate, dibehenyl fumarate and a mixture thereof.

9. The method according to claim 5, wherein the photopolymerization initiator is selected from the group consisting of benzophenone, Michler's ketone, benzoin, benzoin methyl ether, benzoin ethyl ether, benzoin isopropyl ether, benzoin isobutyl ether, α-methylolbenzoin, α-methylolbenzoin methyl ether, α-methoxybenzoin methyl ether, benzoin phenyl ether, α-t-biutyl benzoin, 2,2-dimethoxyphenylacetophenone, 2,2-diethoxyphenylacetophenone, 2,2-diethoxy acetophenone, benzil, pivaloin, anthraquinone, benzanthraquinone, 2-ethyl anthraquinone, 2-chloroanthraquinone and a mixture thereof.

10. The method according to claim 1, wherein the volume ratio of compound (A) to compound (B) is from 80/20 to 50/50.

11. The method according to claim 1, wherein the compound (A) is selected from esters of acetic acid or propionic acid.

12. The method according to claim 1, wherein compound (A) is selected from the group consisting of 3-methoxybutyl acetate, 3-methoxybutyl propionate, 4-(4'-methoxybutoxy)butyl acetate and 2-(2'-butoxyethoxy)ethyl acetate.

13. The method according to claim 1, wherein compound (B) is selected from the group consisting of isopropanol, butanol, 1-pentanol, 2-methylpropanol, hexanol, heptanol, n-octanol, 2-ethylhexanol, nonyl alcohol, decyl alcohol, benzyl alcohol, 2-phenylethanol, 3-methoxybutanol, 2-butoxyethanol, 4-(4'-methoxybutoxy)butanol and 3-methoxy-3-methylbutanol.

* * * * *